(12) United States Patent
Kim

(10) Patent No.: US 8,149,642 B2
(45) Date of Patent: Apr. 3, 2012

(54) SEMICONDUCTOR MEMORY DEVICE

(75) Inventor: Saeng Hwan Kim, Suwon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 343 days.

(21) Appl. No.: 12/459,093

(22) Filed: Jun. 26, 2009

(65) Prior Publication Data

US 2010/0201411 A1    Aug. 12, 2010

(30) Foreign Application Priority Data

Feb. 12, 2009  (KR) .................. 10-2009-0011600

(51) Int. Cl.
*G11C 5/14* (2006.01)
(52) U.S. Cl. ............... 365/226; 365/227; 365/229
(58) Field of Classification Search .......... 365/226, 365/227, 229
See application file for complete search history.

(56) References Cited

U.S. PATENT DOCUMENTS

| 5,703,825 | A | * | 12/1997 | Akiba et al. | .................. 365/229 |
| 5,933,384 | A | * | 8/1999 | Terada et al. | ................. 365/227 |
| 6,041,013 | A | | 3/2000 | Kohno | |
| 6,188,628 | B1 | * | 2/2001 | Tomotani | ...................... 365/226 |
| 7,199,644 | B2 | * | 4/2007 | Fujimoto | ..................... 327/538 |
| 2005/0237848 | A1 | | 10/2005 | Takahashi et al. | |

FOREIGN PATENT DOCUMENTS

| KR | 10-2004-0002270 | | 1/2004 |
| KR | 10-2007-0096123 | A | 10/2007 |

* cited by examiner

*Primary Examiner* — Son Dinh
(74) *Attorney, Agent, or Firm* — John P. White; Cooper & Dunham LLP

(57) ABSTRACT

A semiconductor memory device includes a first power switch for interrupting supply of a first power voltage to a first node in a standby mode, and a second power switch connected between the first node and a second node applied with a second power voltage.

12 Claims, 3 Drawing Sheets

SEMICONDUCTOR MEMORY DEVICE

TECHNICAL FIELD

The present invention relates to a semiconductor memory device, and more particularly, to a semiconductor memory device capable of preventing generation of leakage current and latch-up.

BACKGROUND

In general, a semiconductor device receives a power voltage (VDD) and a ground voltage (VSS) from an outside and generates and uses an internal voltage required in an internal circuit. The voltage required in the internal circuit of the semiconductor memory device includes, a core voltage (Vcore) supplied to a memory core region, a high voltage (Vpp) used upon driving of a word line or overdriving, and a back bias voltage (VBB) supplied as a bulk voltage of an NMOS transistor in the core region.

Meanwhile, a mobile device such as a mobile phone, a portable multimedia player (PMP) and a notebook computer is easily carryable and can be used during travel, but has a limited operation time due to limitation in a battery capacity. Therefore, in order to lengthen the operation time of the mobile device, there have been tried various attempts for current consumption in a semiconductor memory device used in the mobile device (hereinafter, referred to as a 'mobile semiconductor memory device').

Among such attempts, there is a method of reducing the current consumption in a standby mode in which an actual operation such as read operation and write operation is not performed and command standby state is maintained, which will be described with reference to FIG. 1.

As illustrated in FIG. 1, a conventional semiconductor memory device is provided with a power switch 10 which receives a standby signal STB enabled to a low level in a standby mode and controls supply of a power voltage VDD to an internal circuit 12. The semiconductor with such configuration interrupts the supply of the power voltage VDD to the internal circuit 12 in the standby mode to reduce the current consumption.

However, if the supply of the power voltage VDD is interrupted through the power switch 10 in the standby mode, an input node of the internal circuit 12 is floated and it is thus impossible to exactly confirm the voltage supplied to the internal circuit 12 and unnecessary leakage current can be generated. Also, in a case that a PMOS transistor of an inverter included in the internal circuit 12 receives the power voltage VDD as a bulk voltage, the voltage of the node floated in the standby mode is supplied as the bulk voltage of the PMOS transistor, thereby capable of causing latch-up.

BRIEF SUMMARY

In an aspect of this disclosure, there is provided a semiconductor memory device capable of preventing generation of leakage current and latch-up by applying a predetermined voltage to an input node floated as supply of a power voltage is interrupted in a standby mode.

In an embodiment, a semiconductor memory device includes a first power switch for interrupting supply of a first power voltage to a first node in a standby mode, and a second power switch connected between the first node and a second node applied with a second power voltage.

In another embodiment, a semiconductor memory device includes a first power voltage driving unit for driving a first power voltage, a first power switch for transferring the first power voltage to a first node in response to a standby signal, a second power voltage driving unit for driving a second power voltage to output the driven voltage to a second node, a second power switch connected between the first and second nodes, and an internal circuit connected between the first and second nodes.

In another embodiment, a semiconductor memory device includes a first power voltage driving unit for driving a first power voltage, a first power switch for transferring the first power voltage to a first node in response to a standby signal, and a second power switch connected between the first node and a ground voltage.

In yet another embodiment, a semiconductor memory device includes a first power switch for transferring a first power voltage in response to a standby signal, and a second power switch formed within a memory chip including a plurality of internal circuits, and connected between a first node, to which the first power voltage is transferred through the first power switch, and a second node.

BRIEF DESCRIPTION OF THE DRAWINGS

The above and other aspects, features and other advantages will be more clearly understood from the following detailed description taken in conjunction with the accompanying drawings, in which.

DETAILED DESCRIPTION OF THE PREFERRED EMBODIMENTS

Hereinafter, an embodiment of the present invention will be described with reference to accompanying drawings. The embodiment is for illustrative purposes only, and the scope of the present invention is not limited thereto.

Figure 1:
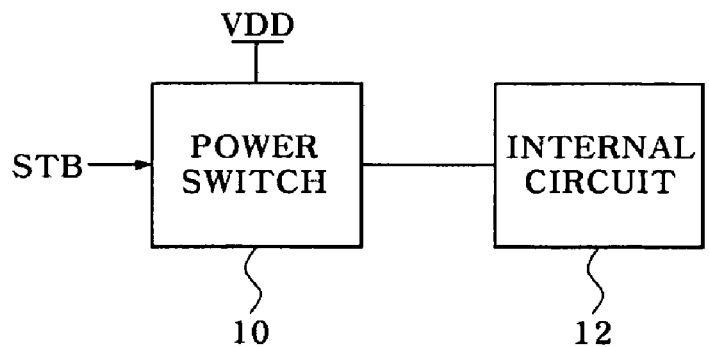
FIG. 1 is a circuit diagram illustrating a conventional semiconductor memory device.
Figure 2:
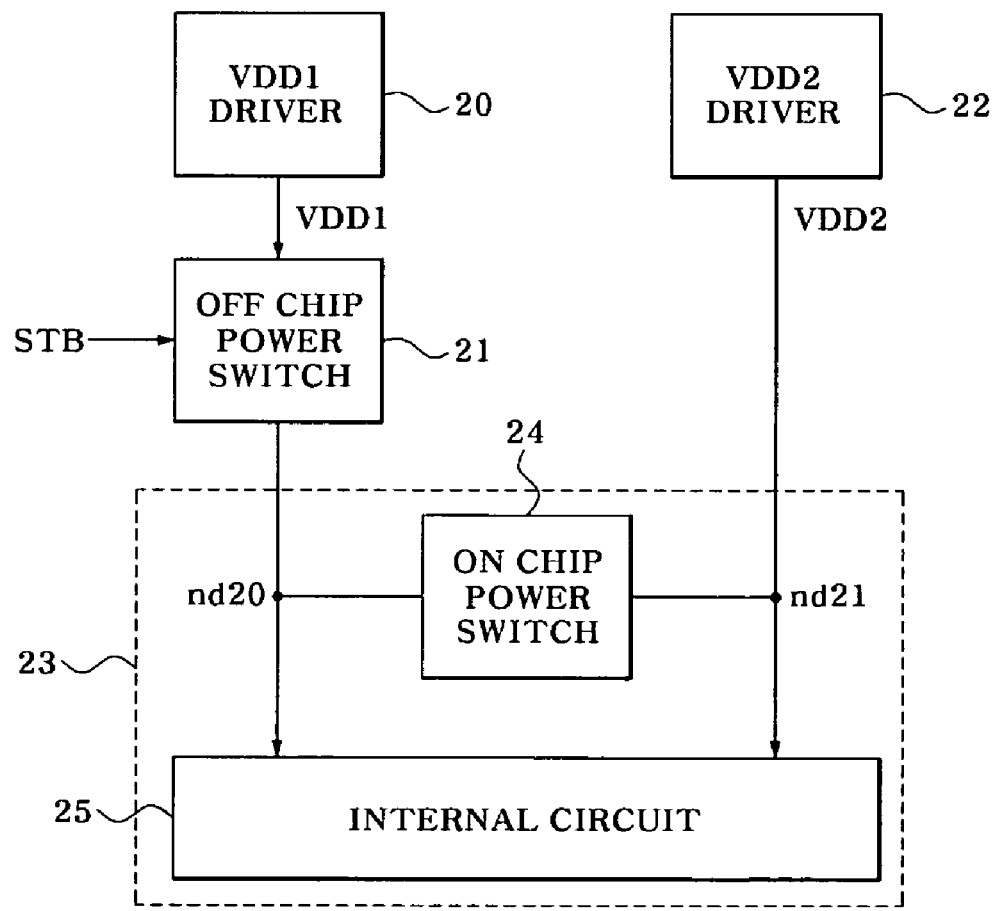
FIG. 2 is a block diagram illustrating a configuration of a semiconductor memory device in accordance with an embodiment of the present invention.

FIG. 2 is a block diagram illustrating a configuration of a semiconductor memory device in accordance with an embodiment of the present invention.

As illustrated in FIG. 2, the semiconductor memory device in accordance with an embodiment of the present invention includes a first power voltage driving unit 20 which drives a first power voltage VDD1, an off-chip power switch 21 which transfers the first power voltage VDD1 to a node nd20 in response to a standby signal STB, a second power voltage driving unit 22 which drives a second power voltage VDD2 to output the driven voltage to a node nd21, an on-chip power switch 24 which is connected between the node nd20 and the node nd21 and an internal circuit 25 which is connected between the node nd20 and the node nd21. Here, the on-chip power switch 24 is realized so as to be formed within a memory chip 23 formed with the internal circuit 25. If necessary, the memory chip 23 includes various internal circuits.

The off-chip power switch 21 interrupts the transfer of the first power voltage VDD1 to the node nd20 when the standby signal STB is inputted with a low level, i.e., in a standby mode. At this time, while the node nd20 is floated, the semiconductor memory device in accordance with an embodiment of the present invention and through the on-chip power switch 24 prevents the node nd20 from being floated. Hereinafter, operation of the on-chip power switch 24 in the standby mode will be described through first to third examples of the on-chip power switch 24 illustrated in FIGS. 3 through 5, respectively.

Figure 3:
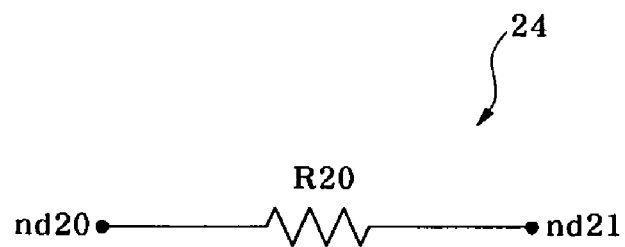
FIGS. 3 through 5 are views illustrating first through third examples of on-chip power switch included in the semiconductor memory device of FIG. 2.

FIG. 3 illustrates a first example wherein on-chip power switch 24 includes a resistor device R20 connected between the node nd20 and the node nd21. By the on-chip power switch 24 with this configuration, a level of the node nd20 can be set to a suitable level (formed by lowering the second power voltage VDD2 through the resistor device R20) by a voltage of the node nd21 applied with the second power voltage VDD2, although the node nd20 is floated in the standby mode.

Figure 4:
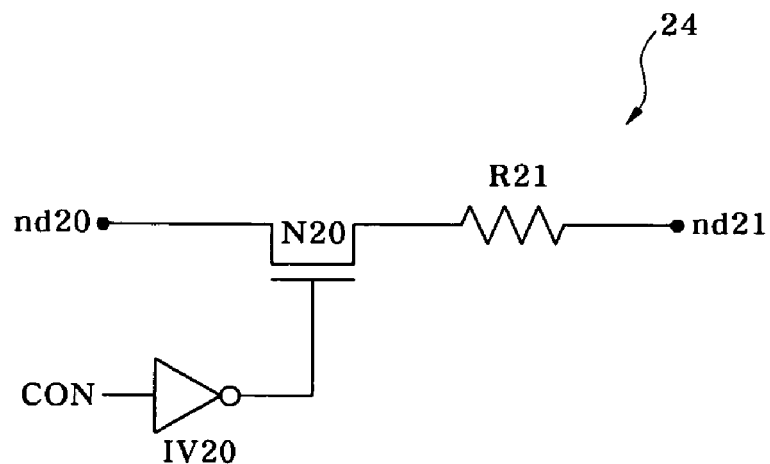

FIG. 4, illustrates a second example wherein on-chip power switch 24 includes an NMOS transistor N20 and a resistor device R21 serially connected between the node nd20 and the node nd21. Here, the NMOS transistor N20 is turned on when a mode signal CON which is enabled to a low level in the standby mode is inputted. By the on-chip power switch 24 with this configuration, a level of the node nd20 can be set to a suitable level (formed by lowering the second power voltage VDD2 through the resistor device R21 and a turn-on resistor of the NMOS transistor N20) by a voltage of the node nd21 applied with the second power voltage VDD2, although the node nd20 is floated in the standby mode. If necessary, the mode signal CON can be a clock enable signal CKE so that the NMOS transistor N20 is turned on in a power down mode.

Figure 5:
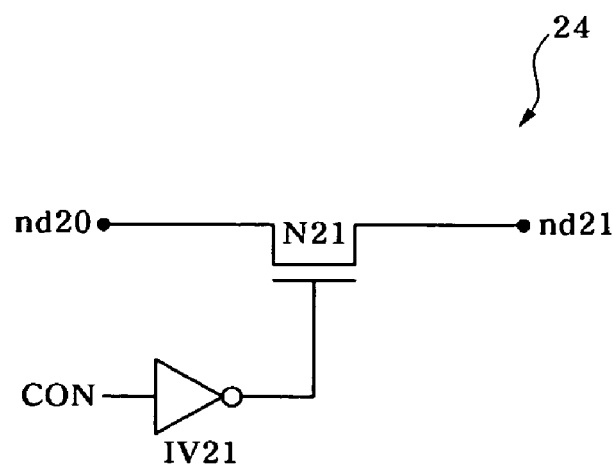

FIG. 5 illustrates a third example wherein on-chip power switch 24 includes an NMOS transistor N21 connected between the node nd20 and the node nd21. Here, the NMOS transistor N21 is turned on when a mode signal CON which is enabled to a low level in the standby mode is inputted. By the on-chip power switch 24 with this configuration, a level of the node nd20 can be set to a suitable level (formed by lowering the second power voltage VDD2 through a turn-on resistor of the NMOS transistor N21) by a voltage of the node nd21 applied with the second power voltage VDD2 although the node nd20 is floated in the standby mode. If necessary, the mode signal CON can be a clock enable signal CKE so that the NMOS transistor N21 is turned on in the power down mode.

As such, by utilizing the on-chip power switch (24, 24, 24) of this disclosure described with reference to the examples of FIGS. 3-5, the node nd20 applied with the first power voltage VDD1 can be set to have a suitable level without being floated even in the standby state.

Figure 6:
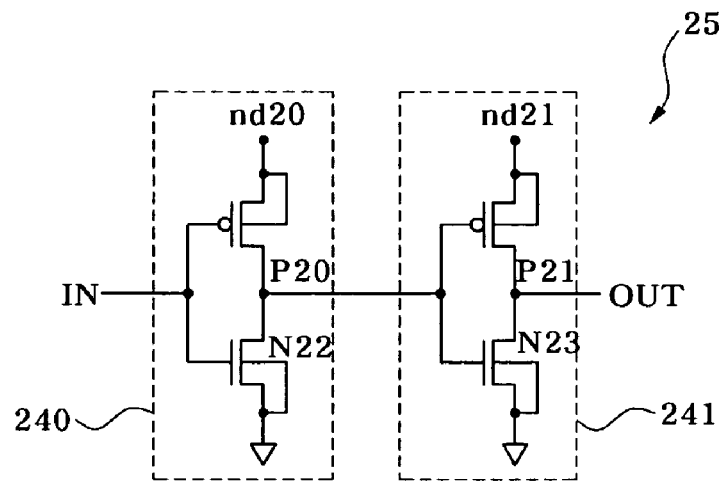
FIG. 6 is a circuit diagram illustrating an internal circuit included in the semiconductor memory device of FIG. 2.

The internal circuit 25 can include, as illustrated in the example of FIG. 6, a first buffer 240 having a PMOS transistor P20 and an NMOS transistor N22, and a second buffer 241 having a PMOS transistor P21 and an NMOS transistor N23. Here, the PMOS transistor P20 is supplied with the voltage of the node nd20 as a bulk voltage.

In the example of the internal circuit 25 having such configuration, problems of leakage current and latch-up may occur when the node nd20 is floated in the standby mode. However, in accordance with the present invention, since the node nd20 is set to a suitable level, the problems of leakage current and latch-up do not occur.

Figure 7:
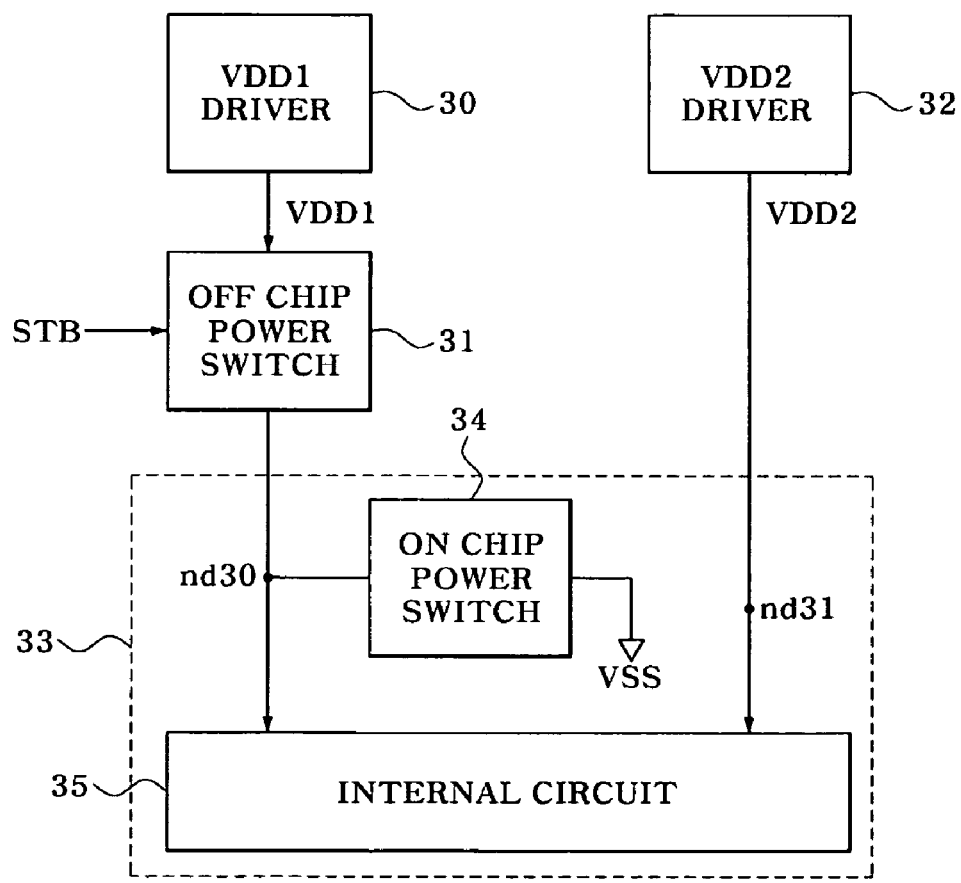
FIG. 7 is a block diagram illustrating a configuration of a semiconductor memory device in accordance with another embodiment of the present invention.

FIG. 7 is a block diagram illustrating a configuration of a semiconductor memory device in accordance with another embodiment of the present invention.

As illustrated in FIG. 7, the semiconductor memory device in accordance with another embodiment of the present invention includes a first power voltage driving unit 30 which drives a first power voltage VDD1, an off-chip power switch 31 which transfers the first power voltage VDD1 to a node nd30 in response to a standby signal STB, a second power voltage driving unit 32 which drives a second power voltage VDD2 to output the driven voltage to a node nd31, an on-chip power switch 34 which is connected between the node nd30 and a ground voltage VSS, and an internal circuit 35 which is connected between the node nd30 and the node nd31. Here, the on-chip power switch 34 is realized so as to be formed within a memory chip 33 including the internal circuit 35.

A structural feature of the semiconductor memory device in accordance with the embodiment of FIG. 7 is that the on-chip power switch 34 is connected to the ground voltage VSS instead of the node nd31 unlike the semiconductor memory device in the embodiment illustrated in FIG. 2. Therefore, since a level of the node nd30, supply of the first power voltage VDD1 to which is interrupted in the standby mode, is lowered by a resistor device or an NMOS transistor connected between the node nd30 and the ground voltage VSS and is set to a suitable level, it is possible to solve the problems of leakage current and latch-up resulting from the floating of the node nd30.

While the present invention has been described with respect to the particular embodiments, it will be apparent to those skilled in the art that various changes and modifications may be made without departing from the spirit and scope of the invention as defined in the following claims.

The present application claims priority to Korean application number 10-2009-0011600, filed on Feb. 12, 2009, which is incorporated by reference in its entirety.

What is claimed is:

1. A semiconductor memory device, comprising:
    a first power switch configured to interrupt supply of a first power voltage to a first node in a standby mode; and
    a second power switch configured to include a switch device connected between the first node and a second node and turned on in response to a mode signal, and a resistor device connected between the second node and a third node applied with a second power voltage.

2. The semiconductor memory device of claim 1, wherein the mode signal is enabled to turn on the switch device in at least one of the standby mode and a power down mode.

3. A semiconductor memory device, comprising:
    a first power voltage driving unit configured to drive a first power voltage;
    a first power switch configured to transfer the first power voltage to a first node in response to a standby signal;
    a second power voltage driving unit configured to drive a second power voltage to output the driven voltage to a second node;
    a second power switch configured to include a switch device connected between the first node and a third node and turned on in response to a mode signal, and a resistor device connected between the third node and the second node; and
    an internal circuit connected between the first and second nodes.

4. The semiconductor memory device of claim 3, wherein the first power switch interrupts the transfer of the first power voltage to the first node in a standby mode.

5. The semiconductor memory device of claim 3, wherein the mode signal is enabled in to turn on the switch device at least one of a standby mode and a power down mode.

6. A semiconductor memory device, comprising:
- a first power voltage driving unit configured to drive a first power voltage;
- a first power switch configured to transfer the first power voltage to a first node in response to a standby signal; and
- a second power switch configured to include a switch device connected between the first node and a second node and turned on in response to a mode signal, and a resistor device connected between the second node and the ground voltage.

7. The semiconductor memory device of claim 6, wherein the first power switch interrupts the transfer of the first power voltage to the first node in a standby mode.

8. The semiconductor memory device of claim 6, wherein the mode signal is enabled in the standby mode or a power down mode to turn on the switch device.

9. A semiconductor memory device, comprising:
- a first power switch configured to transfer a first power voltage in response to a standby signal; and
- a second power switch formed within a memory chip including a plurality of internal circuits, and configured to include a switch device connected between a first node and a second node and turned on in response to a mode signal, and a resistor device connected between the second node and a third node, wherein the first power voltage is transferred to the first node through the first power switch.

10. The semiconductor memory device of claim 9, wherein the third node is supplied with one of a second power voltage and a ground voltage.

11. The semiconductor memory device of claim 9, wherein an internal circuit is connected to the first node.

12. The semiconductor memory device of claim 9, wherein the mode signal is enabled in the standby mode or a power down mode to turn on the switch device.

* * * * *